United States Patent [19]

Hayashi et al.

[11] Patent Number: 5,576,244
[45] Date of Patent: Nov. 19, 1996

[54] METHOD OF MANUFACTURING SEMICONDUCTOR DEVICES HAVING SILICIDE ELECTRODES

[75] Inventors: Hiromi Hayashi; Atsuo Fushida, both of Kawasaki, Japan

[73] Assignee: Fujitsu Limited, Kawasaki, Japan

[21] Appl. No.: 502,315

[22] Filed: Jul. 13, 1995

Related U.S. Application Data

[62] Division of Ser. No. 295,537, Aug. 25, 1994, Pat. No. 5,482,895.

[30] Foreign Application Priority Data

Aug. 26, 1993 [JP] Japan .................................. 5-211279

[51] Int. Cl.$^6$ ................................................ H01L 21/28
[52] U.S. Cl. ........................... 437/200; 437/41; 437/46; 437/192
[58] Field of Search ...................... 437/200, 201, 437/193, 41, 46, 192

[56] References Cited

U.S. PATENT DOCUMENTS

| | | | |
|---|---|---|---|
| 4,788,160 | 11/1988 | Hevemann et al. | 437/200 |
| 4,821,085 | 4/1989 | Haken et al. | |
| 4,835,112 | 5/1989 | Pfiester et al. | 437/200 |
| 4,855,247 | 8/1989 | Ma et al. | 437/200 |
| 4,873,204 | 10/1989 | Wong et al. | |
| 4,885,259 | 12/1989 | Osinski et al. | 437/200 |
| 5,010,032 | 4/1991 | Tang et al. | 437/200 |
| 5,028,554 | 7/1991 | Kita | 437/192 |
| 5,190,893 | 3/1993 | Jones, Jr. et al. | 437/200 |
| 5,387,535 | 2/1995 | Wilmsmeyer | 437/200 |

OTHER PUBLICATIONS

S. Wolf "Silicon Processing for the VLSI Era, vol. 1", Lattice Press, 1986, pp. 57, 58, 303, 304.
S. Wolf, Silicon Processing For The VLSI Era, vol. 2, Lattice Press 1990, pp. 162–167.

Primary Examiner—George Fourson
Assistant Examiner—Thomas G. Bilodeau
Attorney, Agent, or Firm—Armstrong, Westerman, Hattori, McLeland & Naughton

[57] ABSTRACT

A method of manufacturing a semiconductor substrate with a silicide electrode (interconnection) capable of forming a local interconnection by using a silicide formation technique. The method includes the steps of: selectively oxidizing the surface of a silicon semiconductor substrate to form a local oxide film and to define at least partially a silicon surface; depositing a cobalt film covering the silicon surface and local oxide film; depositing a silicon film on the cobalt film, and patterning the silicon film to form a silicon film pattern extending from the silicon surface to the local oxide film; forming a TiN film over the cobalt film; heating the substrate to progress a silicidation reaction between the cobalt film and silicon surface and between the cobalt film and silicon film pattern; and removing the remaining TiN film and an unreacted portion of the cobalt film.

11 Claims, 16 Drawing Sheets

METHOD OF MANUFACTURING SEMICONDUCTOR DEVICES HAVING SILICIDE ELECTRODES

This is a division of application Ser. No. 08/295,537 filed Aug. 25, 1994 now U.S. Pat. No. 5,482,895.

BACKGROUND OF THE INVENTION a) Field of the Invention

The present invention relates generally to a silicon semiconductor device, and more particularly to a method of manufacturing a semiconductor device with silicide electrodes (interconnections).

b) Description of the Related Art

Fine elements and low power consumption circuits are required for semiconductor integrated circuits. In reducing power consumption, a CMOS (complementary metal-oxide-semiconductor) circuit is advantageous over other circuits. Fine MOS transistors lead to a problem of a short channel effect by which drain current uncontrollable by gate voltage flows under application of drain voltage. This short channel effect is likely to occur if source/drain regions are deep relative to the distance (channel length) thereof.

In order to suppress the short channel effect, shallow source/drain impurity diffusion regions are desired. A resistance of a shallow impurity diffusion region is high. It is effective to form a low resistance film on the surface of an impurity diffusion region in order to lower the resistance thereof. From this viewpoint, silicide formation technique is becoming important.

It is also desired to lower the resistance of a silicon electrode (interconnection) such as a gate electrode without increasing its thickness. To this end, silicide formation technique is also used. A silicon gate and source/drain regions of a transistor, particularly a MOS transistor, can be silicified by the same process.

FIGS. 5A to 5C, 6A to 6C, 8A, and 8B are diagrams explaining an example of the method of manufacturing MOS transistors by using a conventional self alignment type silicifying (salicifying) technique.

As shown in FIG. 5A, a buffer oxide film 137 and a silicon nitride ($SiN_x$) film 138 are deposited on the surface of, for example, a p-type silicon substrate 121. A resist mask is then formed over the silicon nitride film 138 to pattern the film 138 in a predetermined shape. Thereafter, the resist mask is removed. The silicon nitride film 138 functions as an oxygen shielding film and as a mask at a thermal oxidation process.

As shown in FIG. 5B, the silicon substrate 121 is heated to a high temperature to expose it in an oxidizing atmosphere and form a thermal oxide film 122 on the surface of the silicon substrate 121 at the region not covered with the silicon nitride film 138. In this manner, the oxide film 122 is formed by local oxidation of silicon (LOCOS) at the region not masked by the silicon nitride film 138. Such an oxide film is commonly called a field oxide film.

As shown in FIG. 5C, after the LOCOS oxidation, the silicon nitride film 138 and the buffer oxide film 137 are removed and a gate oxide film 123 is formed to a thickness of, for example, about 10 nm by thermal oxidation or the like.

As shown in FIG. 6A, a polycrystalline silicon film 124 is deposited to a thickness of, for example, about 150 nm by CVD (chemical vapor deposition) over the gate oxide film 123 and field oxide film 122.

As shown in FIG. 6B, n-type impurity ions such as phosphorus (P) and arsenic (As) are implanted into the deposited polycrystalline silicon film 124.

If a p-channel MOS transistor is to be formed on an n-type silicon substrate, p-type impurity ions such as boron (B) are implanted. Instead of implanting impurity ions after the polycrystalline silicon film is formed, an impurity doped polycrystalline silicon film may be deposited. The ion implantation process illustrated in FIG. 6B may be omitted if the impurity concentration of the polycrystalline silicon film 124 becomes sufficiently high by an ion implantation process to be performed later.

As shown in FIG. 6C, a resist pattern is formed over the polycrystalline silicon film 124. By using this resist pattern as an etching mask, the polycrystalline silicon film 124 and gate oxide film 123 are selectively etched.

The gate electrode is etched by reactive ion etching (RIE) by an etchant gas of, for example, $Cl_2+O_2$, or HBr. An insulating gate electrode structure of the gate oxide film 123 and polycrystalline silicon film 124 is therefore formed on the surface of the silicon substrate 121.

If an LDD (lightly doped drain) structure is to be formed, n-type impurity ions such as phosphorus and arsenic are lightly doped after the gate electrode structure is formed, to thereby form shallow n-type regions 126a and 127a. At this time, these n-type impurity ions are implanted also into the polycrystalline silicon film 124.

As shown in FIG. 7A, an silicon oxide film 125 is deposited to a thickness of, for example, about 200 nm by CVD.

As shown in FIG. 7B, the deposited silicon oxide film 125 is anisotropically etched by RIE using a mixed gas of $CF_4+CHF_3$ as an etchant. RIE continues until the silicon oxide film 125 on the flat substrate surface is fully etched, leaving the silicon oxide film 125 only at the side walls of the gate electrode structure. In this manner, side walls 125 of the gate electrode are formed.

As shown in FIG. 7C, by using the gate electrode 124 with the side walls 125 as a mask, n-type impurity ions such as phosphorus and arsenic are implanted at a high concentration to form a source region 126 and a drain region 127.

As shown in FIG. 8A, a Ti film 128 is formed over the whole surface of the substrate 121 to a thickness of, for example, about 50 nm by sputtering or the like. The Ti film 128 contacts silicon on the source region 126, drain region 127, and polycrystalline silicon electrode 124, and is deposited on the silicon oxide at the other region.

As shown in FIG. 8B, a thermal treatment is performed, for example, at a temperature of about 700° C., for about 30 seconds. This thermal treatment silicifies the Ti film 128 contacting silicon and forms a titanium silicide film 128a.

After the titan silicide film 128 is formed by a reaction between Ti and silicon, the substrate 121 is immersed in a mixed solution of aqueous ammonia and hydrogen peroxide to remove the unreacted Ti film 128. The silicidation reaction is further progressed by a thermal treatment at a temperature of 800° C. for about 30 seconds. With the two thermal treatment processes, an $TiSi_2$ film is formed on the surface of the polycrystalline silicide gate electrode 124, source region 126, and drain region 127.

Titanium silicide has several phases. The two thermal treatment processes efficiently form the $TiS_2$ film.

A silicide film can thus be formed in a self-alignment manner only on the gate electrode and source/drain regions of a MOS transistor on the silicon surface surrounded by a field oxide film.

In connecting a conductive pattern formed over a semiconductor substrate to another conductive region by a wiring, the surface of the other conductive region is covered with an insulating film, a contact hole is formed in the insulation film, and a wiring pattern is formed for interconnecting the conductive pattern and other conductive region.

In the case of local interconnections for interconnecting a wire pattern formed on a field oxide film and a diffusion region on the substrate surface, if the processes of forming an interlevel insulation film and opening a contact hole can be omitted, it is very desirable in that semiconductor devices can be made small and the processes can be simplified.

U.S. Pat. No. 4,821,085 and U.S. Pat. No. 4,873,204 disclose the formation of such local interconnections. U.S. Pat. No. 4,821,085 discloses a technique of silicifying a Ti film contacting Si and deposited on a substrate with selectively exposed conductive regions, and at the same time, changing the surface of the Ti film into TiN, by heating the substrate in a nitrogen atmosphere. Nitriding the Ti film with a nitrogen gas progresses more preferentially on an oxide film than on Si. A wiring layer contacting the Ti silicide film on the Si surface can be formed. The TiN film is patterned thereafter to form local interconnections.

U.S. Pat. No. 4,873,204 discloses a technique of forming a refractory metal film on an Si substrate with partially exposed Si regions and forming a patterned amorphous Si film on the refractory metal film. A thermal treatment is thereafter performed to form Ti silicide only at the regions contacting the Si regions and amorphous Si pattern. A local interconnection is thus formed. With a local interconnection technique by silicifying, a wiring layer connected to the exposed silicon region can be formed in a self-alignment manner.

The manufacturing methods described above implant ions twice into the polycrystalline silicide gate electrode, even if an LDD structure is not formed. At the ion implanting process illustrated in FIG. 6B, different impurity ions are implanted into n- and p-channel MOS transistors. Therefore, different masks are required.

If the ion implanting process illustrated in FIG. 6B is omitted and impurities are implanted into the gate electrode only by the source/drain ion implanting process, the following problems arise.

The depth of source/drain regions becomes about 0.1 μm (100 nm) or less as devices are scaled down and become progressively smaller. A polycrystalline silicon gate electrode is required to have a thickness of about 150 nm. If the source/drain regions and gate electrode are subjected to the same ion implantation and thermal treatment processes, the processes are insufficient for the polycrystalline silicon gate electrode, lowering its conductivity.

It is also difficult to convert the silicon surface doped with impurities at a high concentration into good metal silicide. Therefore, if the dose of ions implanted into the source/drain regions is too large, it becomes difficult to form a silicide film on the surface of the source/drain regions.

Although local interconnections using a silicide formation technique are very effective for making semiconductor devices smaller, it can be said that this technique is not still matured sufficiently.

SUMMARY OF THE INVENTION

It is an object of the present invention to provide a method of manufacturing semiconductor devices capable of forming shallow source/drain regions and polycrystalline silicon electrode (interconnection) having a sufficiently low conductivity.

It is another object of the present invention to provide a method of manufacturing semiconductor devices capable of forming local interconnections having a good performance by using a silicide formation technique.

According to one aspect of the present invention, there is provided a method of manufacturing a semiconductor device including the steps of: forming a silicon gate electrode on a silicon semiconductor substrate, with a gate insulation film being interposed therebetween; covering the exposed surface of the silicon gate electrode with an insulation film and exposing the surface of the substrate on the opposite sides of the gate electrode; forming a first refractory metal film over the substrate surface; heating the substrate to progress a silicidation reaction between the first refractory metal film and the substrate surface and form a first refractory metal silicide film; removing an unreacted portion of the first refractory metal film; removing the insulation film on the gate electrode to expose the surface of the gate electrode; implanting impurity ions into the gate electrode and the substrate surface under the first refractory metal silicide film; and heating the substrate to activate the impurity ions.

According to another aspect of the present invention, there is provided a method of manufacturing a semiconductor device including the steps of: selectively oxidizing the surface of a silicon semiconductor substrate to form a local oxide film and defining a silicon surface at least a portion thereof being defined by the local oxide film; depositing a cobalt film covering the silicon surface and the local oxide film; depositing a silicon film on the cobalt film and patterning the silicon film to form a silicon film pattern extending from the silicon surface to the local oxide film; forming a TiN film over the cobalt film; heating the substrate to progress a silicidation reaction between the cobalt film and silicon surface and between the cobalt film and silicon film pattern; and removing the remaining TiN film and an unreacted portion of the cobalt film.

After the refractory metal silicide is formed on the surface of the semiconductor substrate, ions are implanted into the silicon gate electrode and under the surface of the semiconductor substrate. Ion implantation under the surface of the semiconductor substrate becomes shallow by the refractory metal silicide formed thereon.

The cobalt film is deposited extending from the silicon substrate surface to the local oxide film. The silicon film patter is formed on the cobalt film. After the cobalt film is covered with the TiN film, a silicidation reaction is performed. It is therefore possible to form a good silicide film on the substrate surface and the local oxide film, by using the cobalt film easy to oxidate.

As described above, according to the present invention, a good silicide electrode and silicide wiring can be formed without complicating the manufacturing processes.

With a silicide local interconnection, a semiconductor device can be made further small.

Use of Co silicide improves the performance of a semiconductor device with ease.

DETAILED DESCRIPTION OF THE PREFERRED EMBODIMENTS

A method of manufacturing a MOS transistor according to an embodiment of the invention will be described with reference to FIGS. 1A to 1C, 2A to 2C, 3A to 3C, 4A, and 4B. An n-channel MOS transistor is formed by way of example.

Figure 1A:
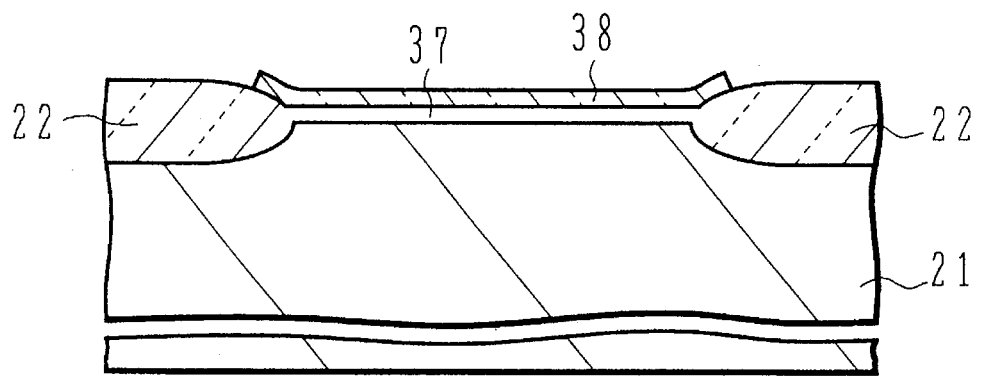
FIGS. 1A to 1C, 2A to 2C, 3A to 3C, 4A, and 4B are cross sectional views explaining the method of manufacturing a semiconductor device according to an embodiment of the present invention.

As shown in FIG. 1A, a buffer oxide film 37 and a silicon nitride film 37 are formed on the surface of a p-type Si substrate 21. The silicon nitride film 38 is patterned in a predetermined shape. The Si substrate 21 is heated in an oxidizing atmosphere to perform local oxidation using the silicon nitride film as a mask and form a field oxide film 22 to a thickness of, for example, about 500 nm. After the local oxidation, the silicon nitride film 38 and buffer oxide film 37 are removed.

Figure 1B:
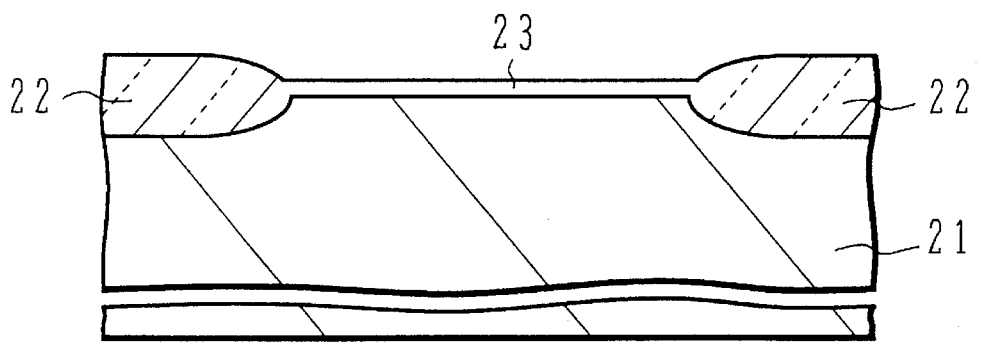

As shown in FIG. 1B, a gate oxide film 23 is formed on the surface of the Si substrate 21 by thermal oxidation to a thickness of, for example, about 10 nm.

Figure 1C:
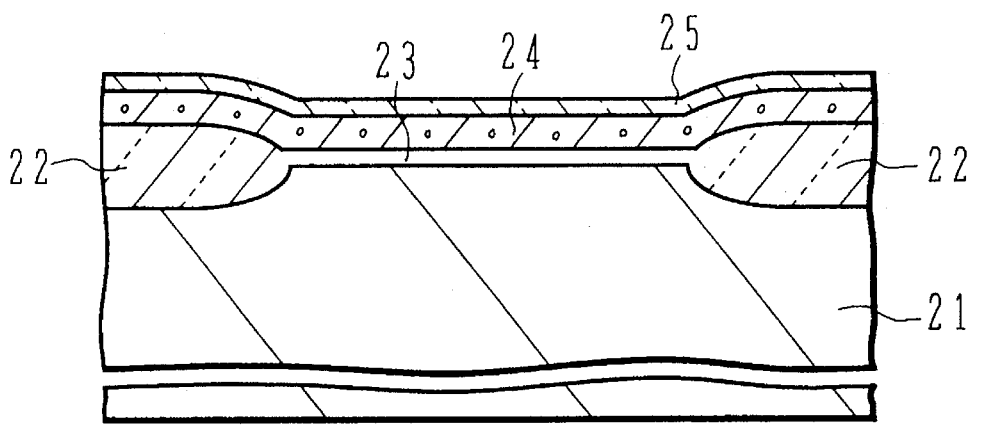

As shown in FIG. 1C, an amorphous silicon film 24 having a thickness of about 150 nm and a silicon nitride film 25 having a thickness of about 50 nm are deposited uniformly on the surface of the field oxide film 22 and gate oxide film 23, by chemical vapor deposition (CVD). Thereafter, a resist mask for patterning a gate electrode is formed on the silicon nitride film 25. The amorphous silicon film is formed at a pressure of 0.3 Torr and a temperature of 450° C. by CVD using $Si_2H_6$ as a source gas, and the silicon nitride film is formed at a pressure of 0.4 Torr and a temperature of 720° to 775° C. by CVD using $SiHCl_3+NH_3$ as a source gas.

Figure 2A:
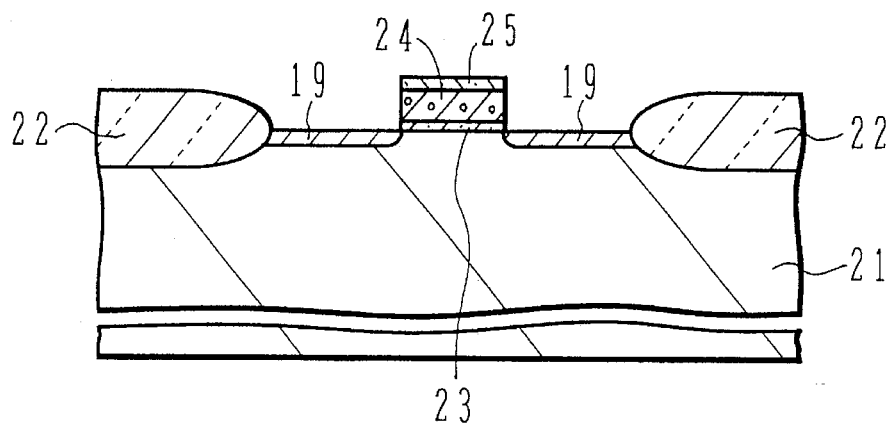

As shown in FIG. 2A, by using the resist mask as an etching mask, the silicon nitride film 25, amorphous silicon film 24, and gate oxide film 23 are patterned. An insulated gate electrode having a gate length of about 0.3 μm is formed by reactive ion etching by using, for example, $Cl_2+O_2$, or HBr as an etching gas.

If necessary, lightly doped n-type regions 19 are formed by ion implantation, by using the insulated gate electrode 23, 24, 25 as a mask. These n-type regions 19 are used for forming source/drain regions of an LDD structure. If the LDD structure is not used, this ion implanting process can be omitted.

Figure 2B:
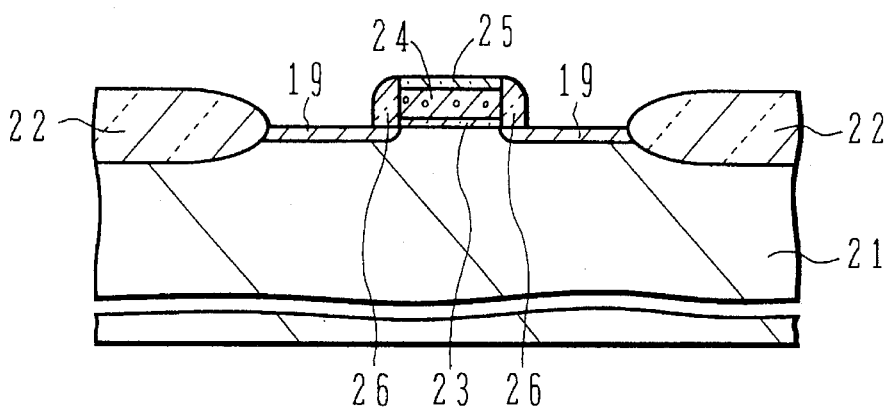

As shown in FIG. 2B, a silicon oxide film 26 is deposited to a thickness of, for example, about 80 nm by CVD. This silicon oxide film 26 on the flat surface is etched by RIE using a mixed gas of $CF_4+CHF_3$ as an etching gas, leaving side walls 26 of the gate electrode.

With this RIE, the silicon nitride film 25 on the amorphous gate electrode 24 is exposed. After RIE, the Si substrate is washed by diluted HF aqueous solution to remove possible natural oxide films on the surface of the Si substrate.

Figure 2C:
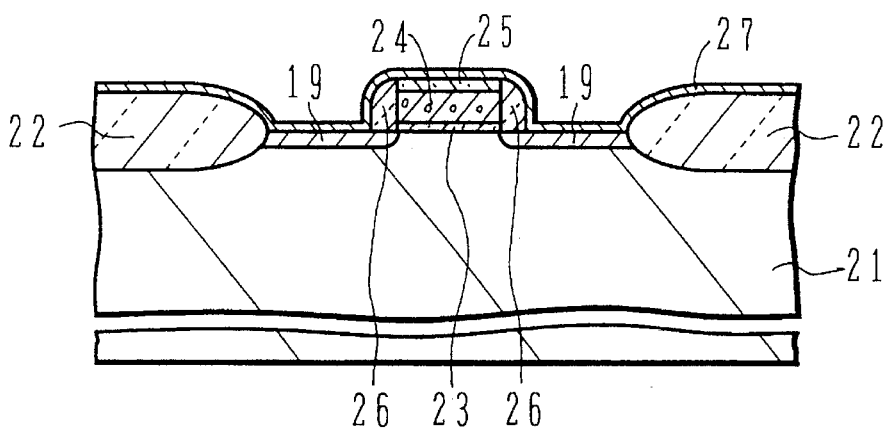

As shown in FIG. 2C, a Co film 27 is deposited to a thickness of, for example, about 10 nm on the whole surface of the Si substrate 21, by sputtering or the like. For example, this sputtering process is performed by flowing an Ar gas as a sputtering gas at 100 sccm and applying an RF power of about 3.7 $W/cm^2$ to a Co target at a sputtering chamber pressure of about 0.1 Pa.

The Co film 27 contacts the surface of the Si substrate 21 where the source/drain regions are formed, and is separated from the amorphous silicon gate electrode 24 by the silicon nitride film 25.

Figure 3A:
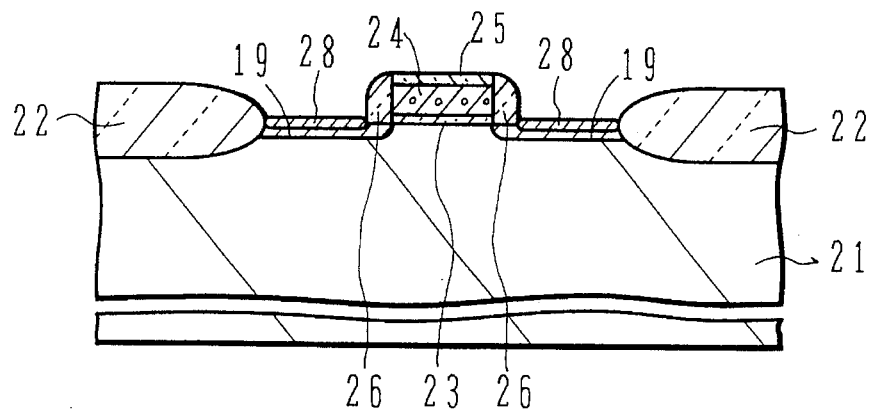

As shown in FIG. 3A, the Co film is silicified by subjecting the substrate 21 to a thermal treatment at a temperature of about 700° C. for about 30 seconds. The Co film contacting Si is silicified and a silicide film is formed. The gate electrode 24 is not silicified because it is covered with the silicon nitride film 25.

Thereafter, the substrate 21 is immersed in a mixed liquid ($HCl:H_2O_2=3:1$) of HCl aqueous solution and hydrogen peroxide ($H_2O_2$), to thereby remove the unreacted Co film 27 left on the field oxide film 22, side walls 26, and silicon nitride film 25. The cobalt silicide film 28 is formed only at the region where the source/drain regions of a MOS transistor are formed.

Figure 3B:
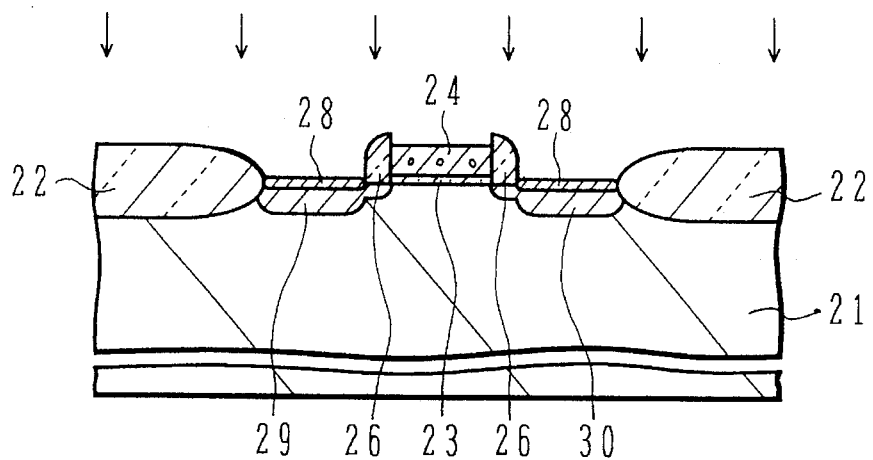

As shown in FIG. 3B, the substrate 21 is immersed in a heated phosphoric acid liquid to remove the silicon nitride film 25 and expose the surface of the amorphous silicon gate electrode 24. Thereafter, n-type impurity ions such as phosphorus and arsenic are implanted. For example, As ions are implanted at an acceleration voltage of about 40 keV and at a dose of $5\times10^{15}$ $cm^{-2}$.

As ions are implanted directly into the amorphous silicon gate electrode 24 and are distributed relatively deep in the gate electrode 24. The ion implantation depth of the source region 29 and drain region 30 is reduced because the cobalt silicide film 28 covers these regions 29 and 30.

Thereafter, a thermal treatment is performed at a temperature of 850° C. for about 30 minutes. With this thermal treatment, the implanted ions are activated and sufficiently diffused in the gate electrode 24. The amorphous silicon is converted into polycrystalline silicon. The cobalt silicide film 28 is changed entirely to $CoSi_2$. In this manner, a low resistance polycrystalline gate electrode 24 and shallow and low resistance source/drain regions 29 and 30 are formed.

Figure 3C:
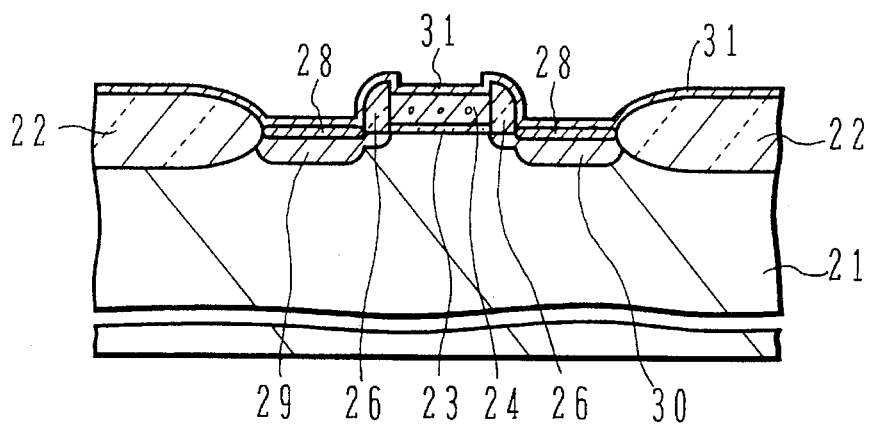

As shown in FIG. 3C, the Si substrate 21 is immersed in a diluted HF liquid to remove possible natural oxide films on the silicon surface. Next, the Si substrate 21 is placed in a sputtering apparatus to deposit a Co film 31 to a thickness of about 10 nm by sputtering. This Co film 31 directly contacts the gate electrode, and contacts the cobalt silicide film 28 at the source/drain regions 29 and 30.

Figure 4A:
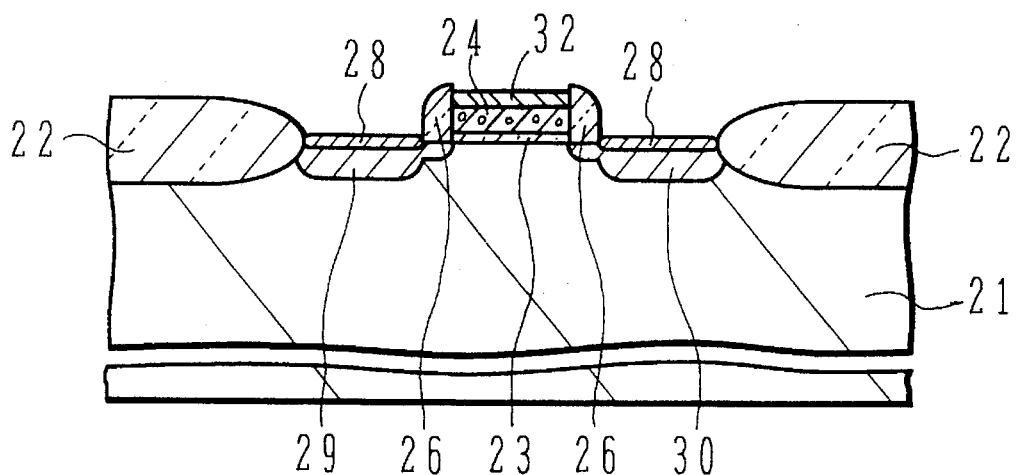

As shown in FIG. 4A, the Si substrate 21 is subjected to a thermal treatment at a temperature of about 700° C. for about 30 seconds to progress a silicidation reaction between the Co film 31 and silicon gate electrode 24. The silicidation reaction is not performed on the silicon oxide films 22 and 26, and is rarely performed on the silicide film 28.

In the above manner, the cobalt silicide film 32 is formed on the gate electrode 24. Thereafter, the Si substrate 21 is immersed in a mixed liquid of $HCl+H_2O_2$ (3:1) to remove the unreacted Co film 31.

Figure 4B:
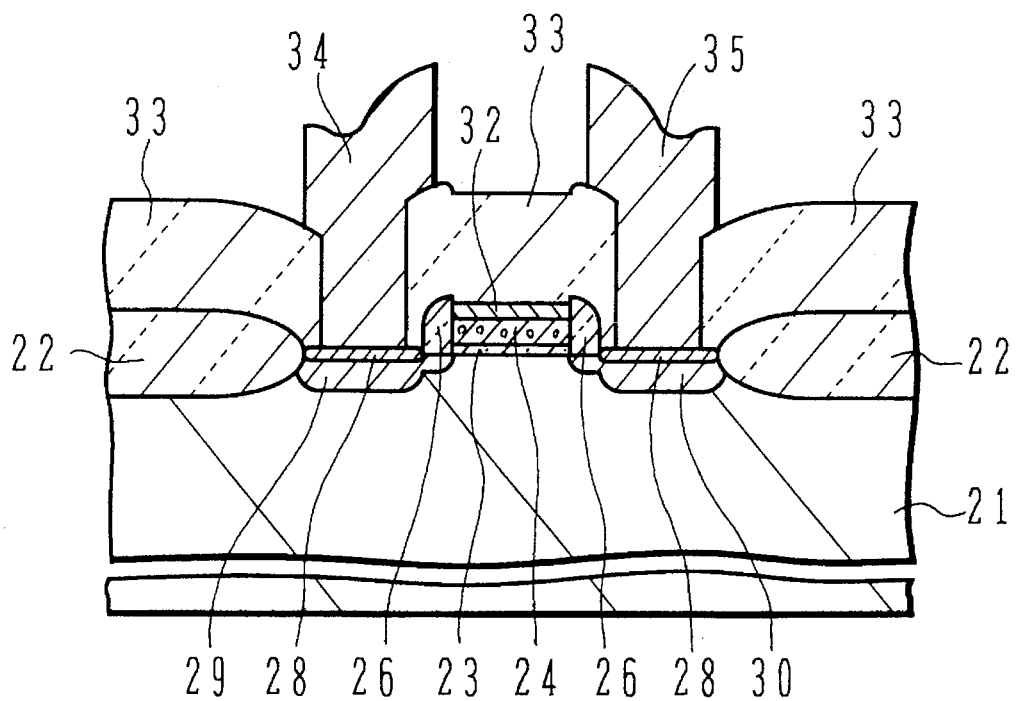
Figure 5A:
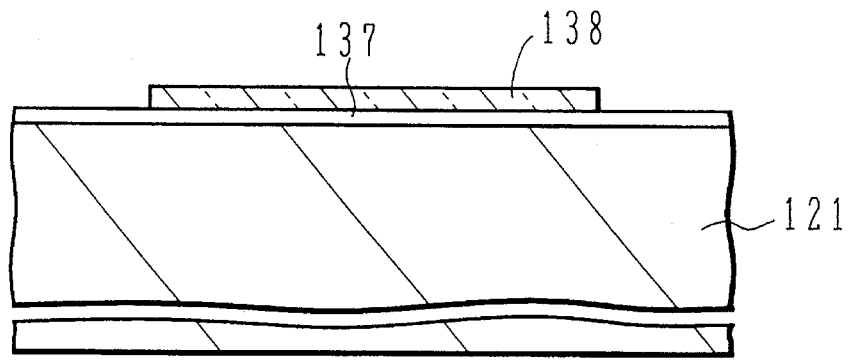
FIGS. 5A to 5C, 6A to 6C, 7A to 7C, 8A, and 8B are cross sectional views explaining a conventional method of manufacturing a semiconductor device.
Figure 5B:
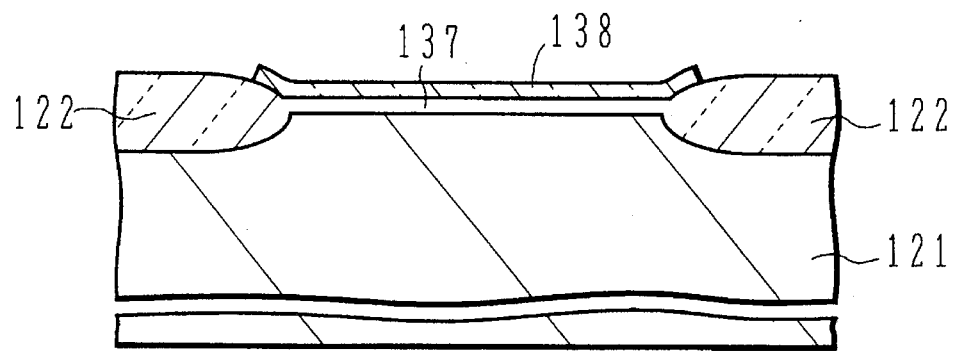
Figure 5C:
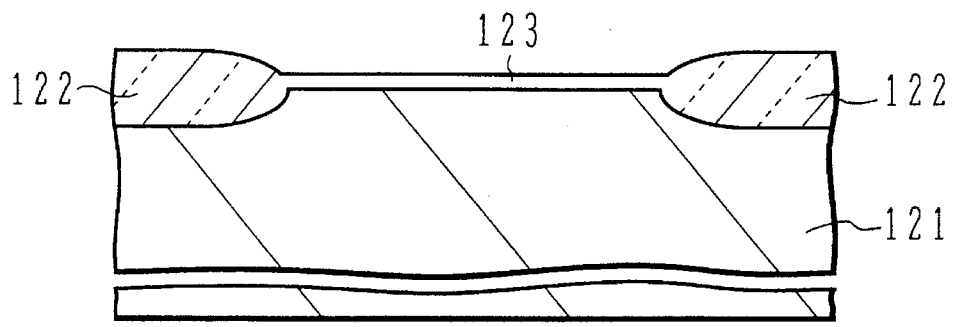
Figure 6A:
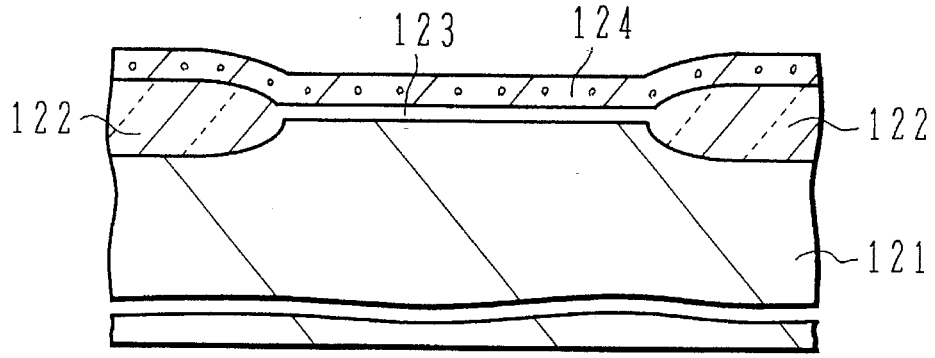
Figure 6B:
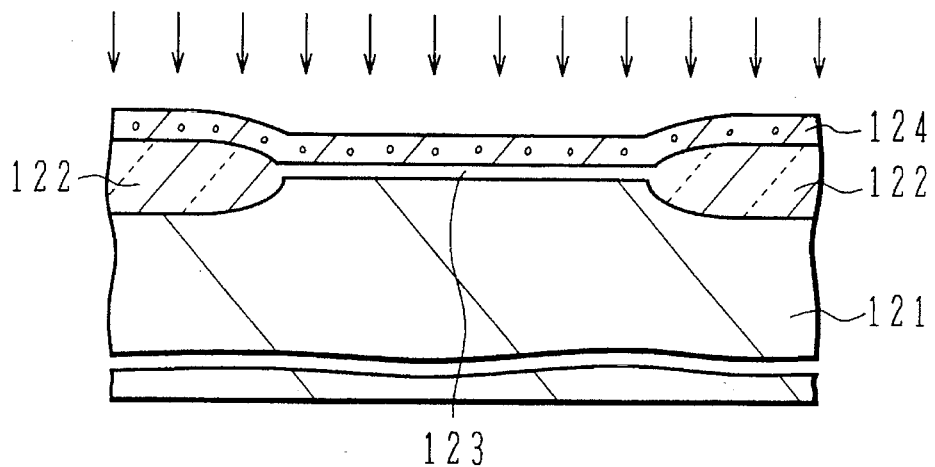
Figure 6C:
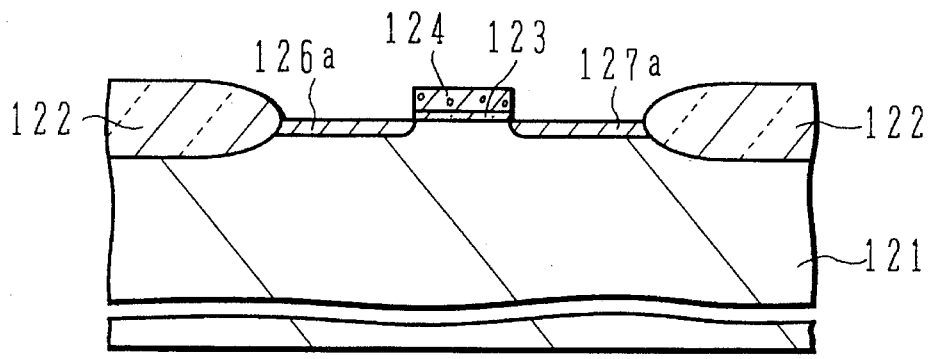
Figure 7A:
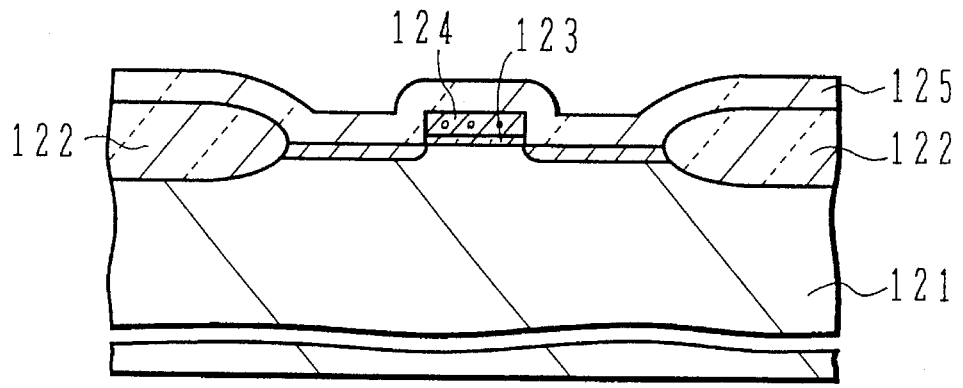
Figure 7B:
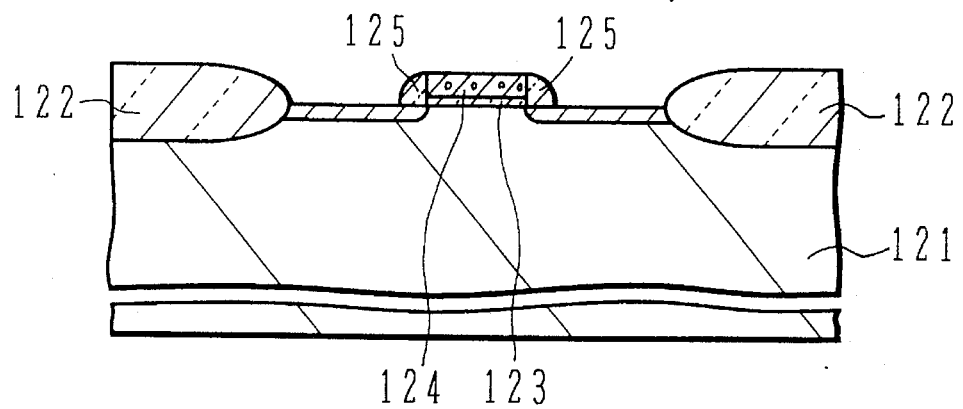
Figure 7C:
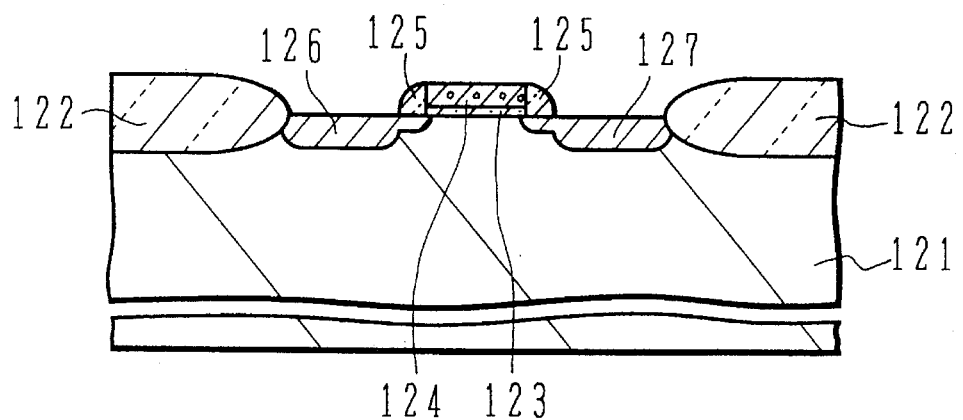
Figure 8A:
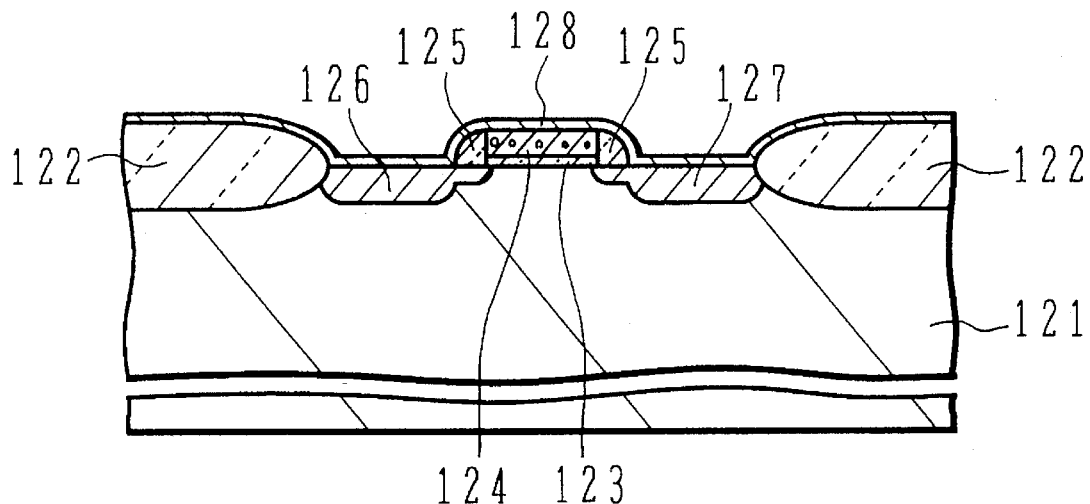
Figure 8B:
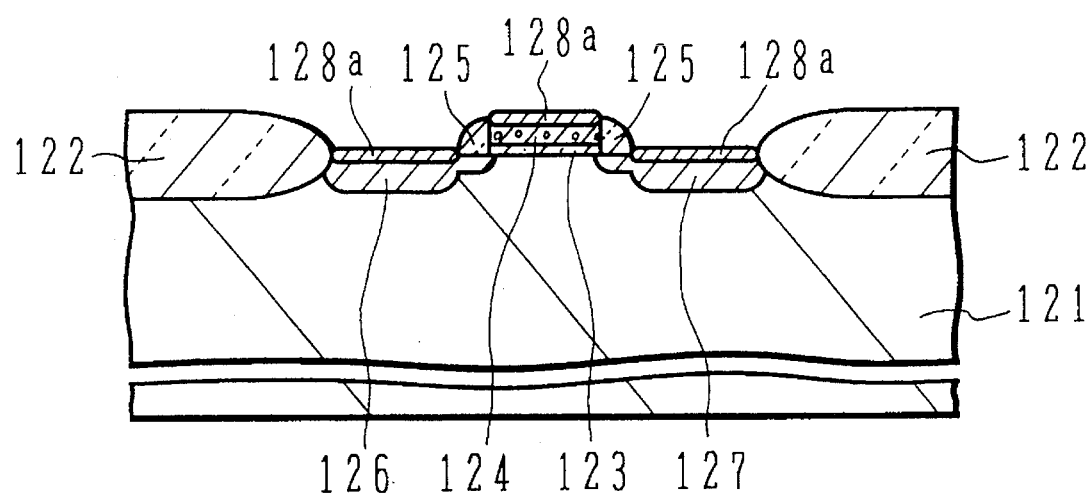

As shown in FIG. 4B, an interlevel silicon oxide insulation film 33 is formed to a thickness of about 400 nm on the surface of the Si substrate 21. A resist film is coated over the interlevel insulation film 33 and patterned to form contact holes. By using this resist mask as an etching mask, contact holes are opened in the interlevel insulation film 33. This contact hole forming process is performed, for example, by RIE using a mixed gas of $CF_4+CHF_3$ as an etching gas.

After the cobalt silicide film 28 is exposed in the contact holes, a Ti film having a thickness of, for example, about 20 nm and a TiN film having a thickness of, for example, about 100 nm are deposited as a barrier metal by sputtering, and an Al film is deposited thereon to a thickness of, for example, about 500 nm.

A resist mask is formed on the electrode film. The electrode film is patterned by RIE using, for example, a $Cl_2$ gas as an etching gas, to form a source electrode 34, a drain electrode 35, and other electrodes. An n-channel MOS transistor is therefore formed.

A p-channel MOS transistor can be formed by similar processes by reversing all conductivity types. In the case of a CMOS device, p- and n-channel MOS transistors are formed in n- and p-wells respectively.

In the embodiment described above, ions are implanted by the process illustrated in FIG. 3B into the source/drain regions via the cobalt silicide film, and are directly implanted into the gate electrode. Therefore, with the single ion implantation, impurity ions are implanted into the gate electrode to a sufficient depth, whereas the source/drain regions having a shallow depth are formed.

With the ion implantation process after the formation of cobalt silicide, the silicidation reaction can be performed sufficiently and the low resistance diffusion regions with cobalt silicide can be formed by doping a sufficiently large amount of impurities in the underlying Si.

Since cobalt silicide is used, the silicide film does not produce a reaction product with implanted impurity ions such as As, B, and P. A tungsten silicide may be used for the same purpose.

It is preferable to perform rapid thermal anneal (RTA) using lamp heating as a thermal treatment for the silicidation reaction. It is possible to perform the subject silicidation reaction while suppressing undesired impurity diffusion. A through oxide film of silicon oxide may be formed on the ion implantation region prior to the ion implantation.

The number of ion implantation processes and the number of masks can be reduced by performing ion implantation after the cobalt silicide film is formed on the source/drain regions. It is possible to implant a sufficient amount of impurity ions into the gate electrode and form a shallow impurity ion implantation regions of the source/drain regions. In this manner, a MOS transistor having a small size and a good performance can be formed.

Next, an embodiment of forming a local interconnection by using a silicidation reaction will be described.

Figure 9A:
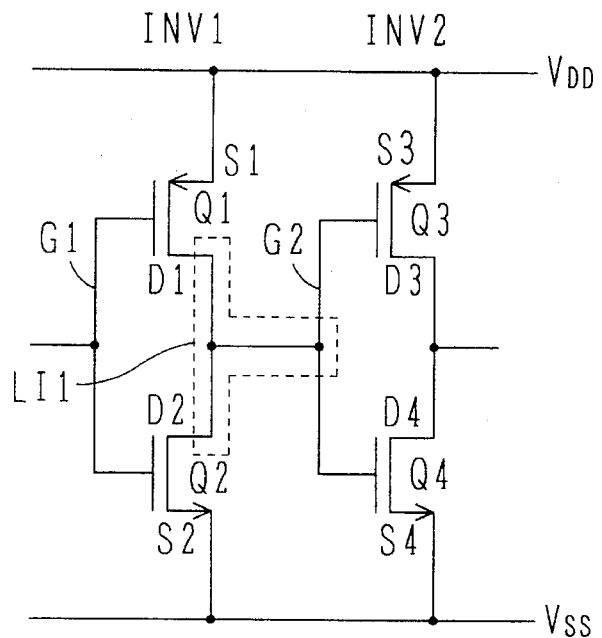
FIGS. 9A and 9B are equivalent circuits of electronic circuits suitable for using local interconnections.
Figure 9B:
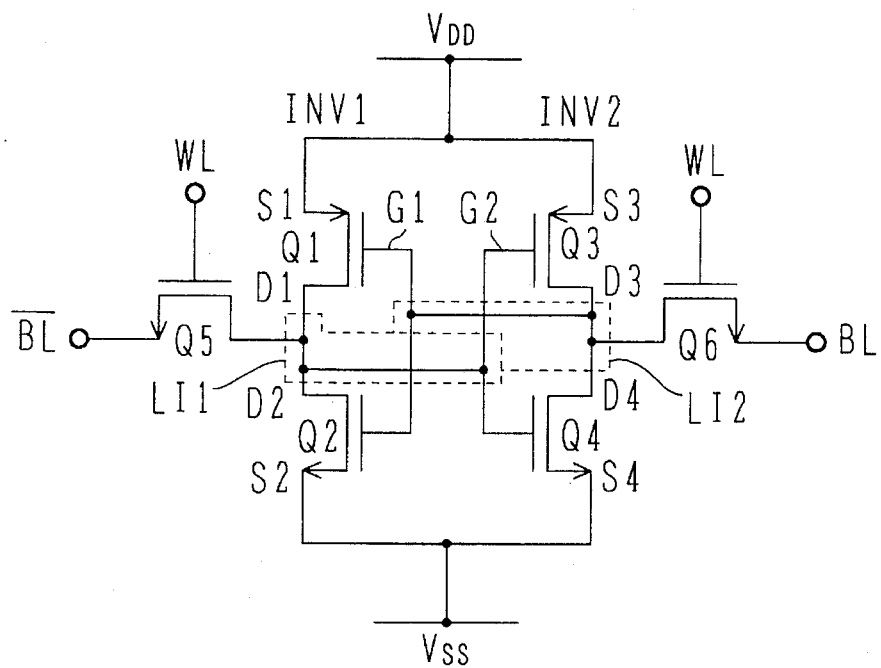

FIGS. 9A and 9B show examples of the circuit structure suitable for using local interconnections. FIG. 9A is an equivalent circuit showing part of a ring oscillator, and FIG. 9B is an equivalent circuit of an SRAM cell.

In FIG. 9A, two inverters INV1 and INV2 are connected between a power source voltage line $V_{DD}$ and a ground line $V_{SS}$ (or two power source lines). In the first inverter INV1, the source S1 of a p-channel MOS transistor Q1 is connected to the power source line $V_{DD}$, and the drain D1 thereof is directly connected to the drain D2 of an n-channel MOS transistor Q2. The source S2 of the n-channel MOS transistor Q2 is connected to the ground line $V_{SS}$. The gates of the two transistors Q1 and Q2 are connected in common to a gate electrode G1 to which an input signal is applied.

In the second inverter INV2, the source S3 of a p-channel MOS transistor Q3 is connected to the power source line $V_{DD}$, and the drain D3 thereof is directly connected to the drain D4 of an n-channel MOS transistor Q4. The source S4 of the n-channel MOS transistor Q4 is connected to the ground line $V_{SS}$. The gates of the two transistors Q3 and Q4 are connected in common to a gate electrode G2. An output line connected to the drains D1 and D2 of the first inverter INV1 is connected to the gate electrode G2 of the second inverter INV2.

A plurality of inverters INV are cascaded between the two power source lines $V_{DD}$ $V_{SS}$ in the similar manner described above. The output line from the drains D1 and D2 of the first inverter INV1 is connected by a local interconnection LI1 to the gate G2 of the second inverter INV2.

In FIG. 9B, two inverters INV1 and INV2 are connected between the two power source lines $V_{DD}$ and $V_{SS}$ similar to the circuit of FIG. 9A. The drains D1 and D2 of the first inverter INV1 are connected by a local interconnection LI1 to the gate electrode G2 of the second inverter.

In the circuit shown in FIG. 9B, an output line from the drains D3 and D4 of the second inverter INV2 is fed back by a local interconnection LI2 to the gate electrode G1 of the first inverter INV1.

An output line of the first inverter INV1 is connected via a transfer transistor Q5 to a bit line BL (BL bar), and the output line from the second inverter INV2 is connected via a transfer transistor Q6 to a bit line BL. The gates of the two transistors Q5 and Q6 are connected to a word line WL.

Figure 10A:
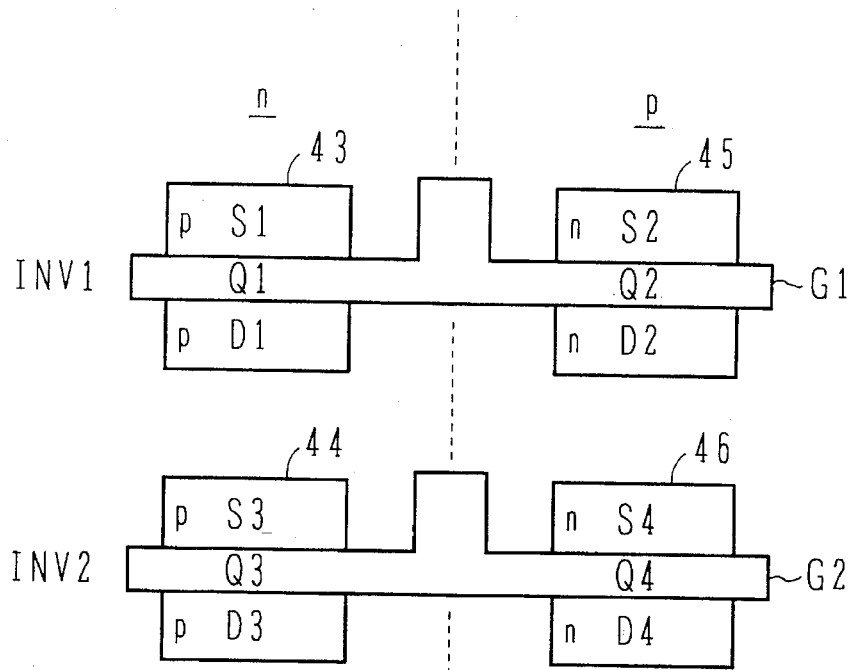
FIGS. 10A and 10B are plan views showing the structure of a semiconductor device realizing the circuit shown in FIG. 9A.
Figure 10B:
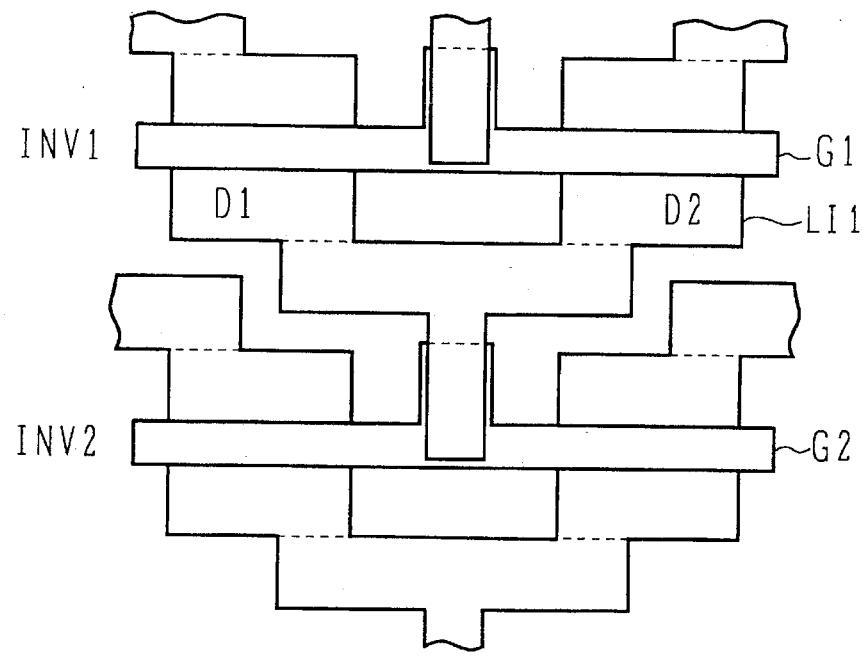

FIGS. 10A and 10B are schematic plan views of a semiconductor device forming part of the ring oscillator shown in FIG. 9A. FIG. 10A is a plan view showing the semiconductor device having gate electrodes formed on the semiconductor substrate and having source/drain regions. In FIG. 10A, an n-well is formed on the left side and a p-well is formed on the right side.

The region other than the n-well surface regions 43 and 44 are covered with a field oxide film. The region other than the p-well surface regions 45 and 46 are also covered with a field oxide film. The gate electrode G1 passes through the surface regions 43 and 45 with a gate oxide film being interposed therebetween. The gate electrode G2 passes through the surface regions 44 and 46 with a gate oxide film being interposed therebetween.

After the gate electrodes G1 and G2 are formed, the p-well region is covered with a resist mask, and p-type impurity ions are implanted to form the p-type source regions S1 and S2 and the p-type drain regions D1 and D3 in the n-well region.

Similarly, the n-well region is covered with a resist mask, and n-type impurity ions are implanted to form the n-type source regions S2 and S4 and the n-type drain regions D2 and D4. In this manner, the basic structure of the four MOS transistors shown in FIG. 9A is formed.

FIG. 10B shows cascaded inverters connected by the local interconnection LI. The local interconnection LI1 interconnects the two drains D1 and D2 of the first inverter INV1 and the gate electrode G2 of the second inverter INV2. The local interconnection LI1 is formed on the field oxide film excepting the portion thereof over the two drain regions D1 and D2 and gate electrode G2, and is not necessary to use an interlevel insulation film so as to electrically separate it from other circuit elements.

It is not possible to form such a local interconnection on a field oxide film by using only the electrode forming process using the silicidation reaction of the above-described embodiment. The following embodiments explain a method of forming a local interconnection on an oxide film for interconnecting circuit elements.

Figure 11:
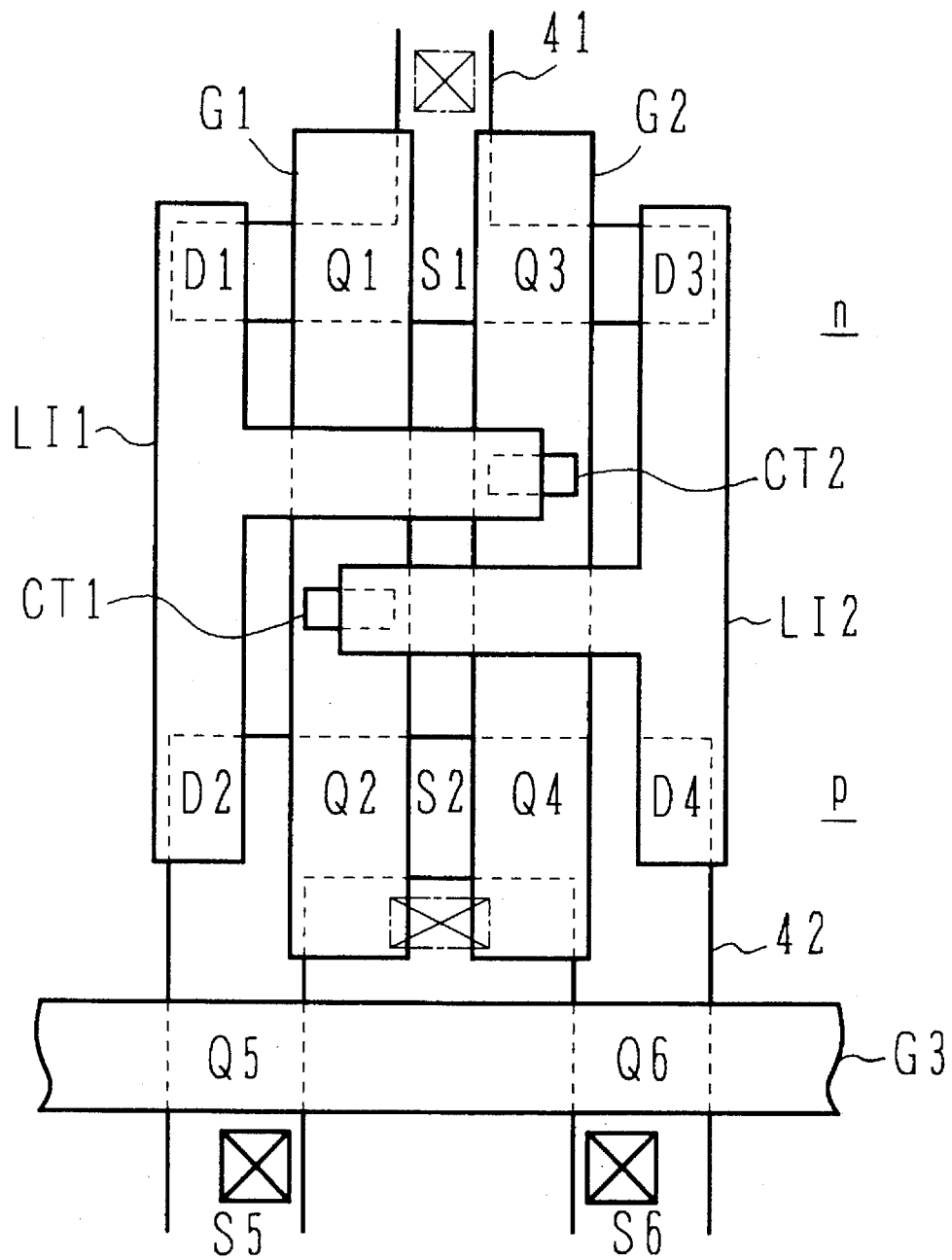
FIG. 11 is a plan view showing the structure of a semiconductor device realizing the circuit shown in FIG. 9B.

FIG. 11 is a plan view of a semiconductor device showing an example of the structure of the SRAM shown in FIG. 9B. In order to form cross local interconnections shown in FIG. 9B, the layout is different from FIGS. 10A and 10B.

In FIG. 11, an n-well is formed on the upper side, and a p-well is formed on the lower side. A surface region 41 in the n-well is surrounded and defined by a field oxide film. Similarly, a surface region 42 in the p-well is surrounded and defined by the field oxide film. The Si surface other than the surface regions 41 and 42 is covered with the field oxide film.

The n-well surface region 41 is of an inverted T shape, and the p-well surface region 42 is of an inverted U shape. The two gates G1 and G2 are formed passing through the horizontal area of the T-shaped surface region 41 and the horizontal area of the U-shaped surface region 42. In this structure, the gate G3 is also formed on the lower side of FIG. 11.

By using these gates G1, G2, and G3 as a mask, ions are implanted. The surface region 41 not covered with the gate electrodes G1 and G2 is doped with p-type impurity ions, and the surface region 42 not covered with the gate electrodes G1, G2, and G3 is doped with n-type impurity ions.

In the above manner, the four MOS transistors Q1, Q2, Q3, and Q4 and the other two MOS transistors Q5 and Q6 are formed.

Of this structure, a common region indicated by S1 in FIG. 11 is used as the source regions of the two MOS transistors Q1 and Q3. Another common region indicated by S2 is used as the source regions of the two MOS transistors Q2 and Q4. The drain regions of the two MOS transistors Q5 and Q6 are the common regions shared by the drain regions of the two MOS transistors Q2 and Q4.

After the basic structure described above is formed, the surface of the gate electrodes G1, G2, and G3 is covered with an insulation film which is removed only at contact regions CT1 and CT2. Specifically, the gate electrodes are exposed only at the contact regions CT, and only the substrate surface regions 41 and 42 not covered with the gate electrodes G1, G2, and G3 are exposed.

Thereafter, the local interconnection LI1 is formed interconnection the drain regions D1 and D2 and the contact region CT2 of the gate electrode G2, and the local interconnection LI2 is formed interconnecting the drain regions D3 and D4 and the contact region CT1 of the gate electrode G1.

Each of the local interconnections LI1 and LI2 contacts the underlying semiconductor surface at three points, and the other portion of each local interconnection is disposed on the insulating film. Therefore, in forming the local interconnections LI1 and LI2, an interlevel insulation film is not needed. Such a local interconnection can be formed by the following embodiment method.

FIGS. 12A to 12D are cross sectional views explaining a method of manufacturing a semiconductor device according to an embodiment of the invention. In FIGS. 12A to 12D, only the necessary elements for forming a local interconnection are shown and other elements are omitted.

Figure 12A:
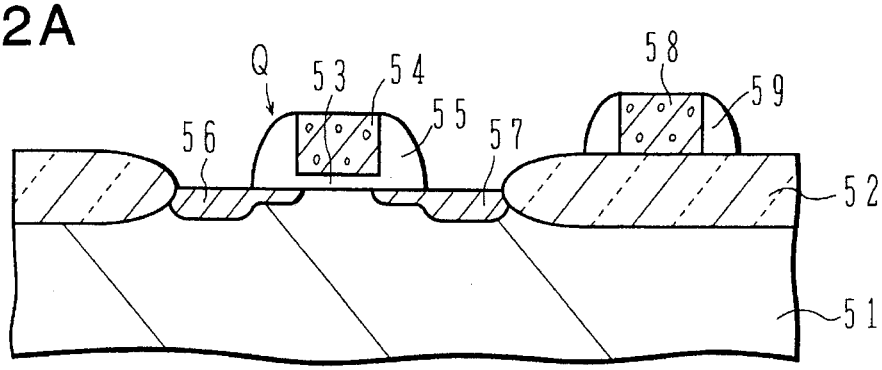
FIGS. 12A to 12D are cross sectional views explaining a method of manufacturing a semiconductor device according to another embodiment of the invention.

As shown in FIG. 12A, a MOS transistor having an LDD structure is formed on the surface of a substrate 51 surrounded by a field oxide film 52, by the processes well known in the art. In the example shown, the MOS transistor is an n-channel MOS transistor formed on a p-type silicon region 51. A silicon gate electrode 54 is formed on a gate insulation film 53, and side walls 55 of an oxide film are formed on the gate electrode 54. An n-type source region 56 and an n-type drain region 57 are formed on the opposite sides of the gate electrode 54. A gate electrode 58 of another transistor extends on the field oxide film 52. Side walls of an oxide film are also formed on the gate electrode 58. In the following, a method of forming a local interconnection for interconnecting the drain region 57 of the MOS transistor and the gate electrode 58 will be described.

Figure 12B:
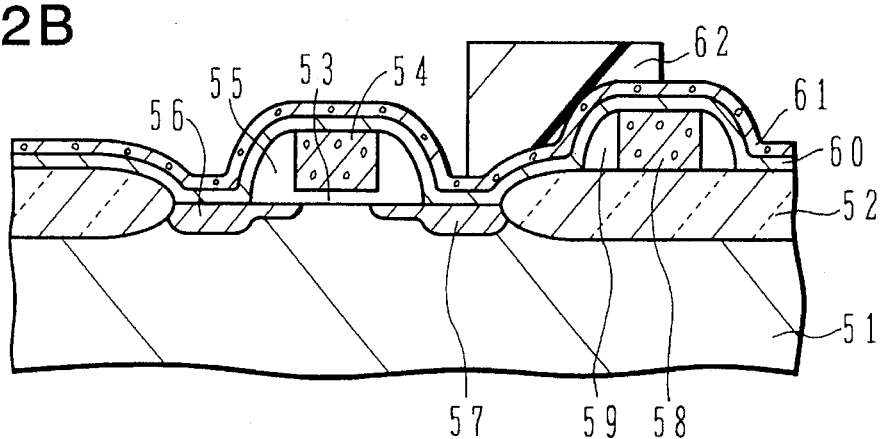

As shown in FIG. 12B, a Co film 60 having a thickness of about 10 nm and an Si film 61 having a thickness of about 30 nm are formed over the surface of the substrate 51, by sputtering. A resist mask 62 is formed covering the region where the Si film 61 is remained unetched.

By using the resist mask 62 as an etching mask, the Si film 61 is etched, for example, by using a parallel plate RIE system under the conditions that an SF6 gas of a flow rate of about 100 sccm is used as an etching gas, a pressure is maintained at about 50 mtorr, and an RF power of about 200 W is applied.

Figure 12C:
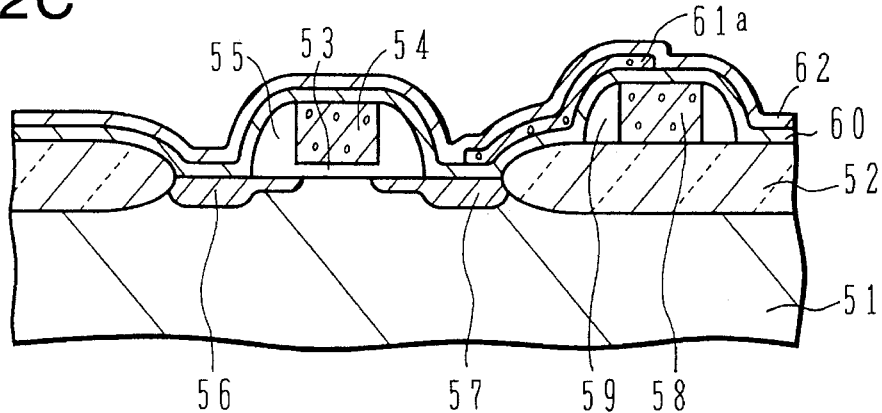

As shown in FIG. 12C, the Si film 61 is etched to form an Si film pattern 61a.

After the etching, the resist pattern 62 is removed by a down-flow ashing system using oxygen plasma. Removing a resist film by a down-flow ashing system generates less damages, allowing damages to the Co film 60 to be minimized.

Thereafter, the substrate is placed in a sputtering apparatus to deposit a TiN film 62 to a thickness of about 30 nm. Therefore, the Co film 60 and TiN film 62 are laminated with the Si film pattern 61a being interposed therebetween.

Thereafter, the substrate is heated to about 1000° C., for example, by RTA to progress a silicidation reaction of the Co film 60. The silicidation reaction progresses at the regions where the Co film 60 contacts the surface of the substrate 51, gate electrodes 54 and 58, and Si film pattern 61a.

Figure 12D:
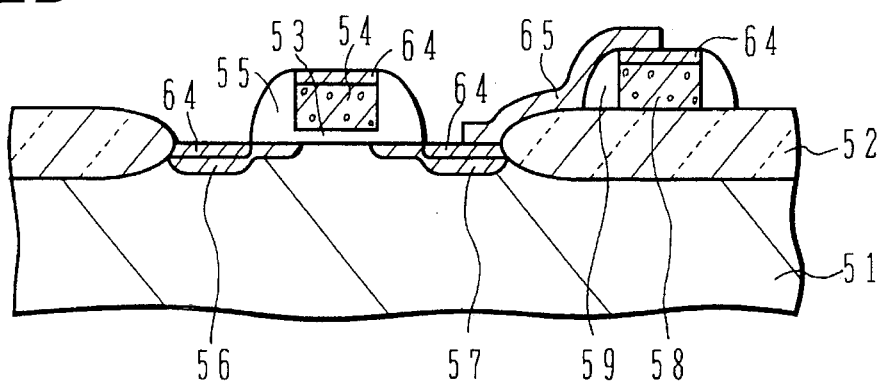

As shown in FIG. 12D, after forming a local interconnection 65 by the silicidation reaction at the Si film pattern 61a, the remaining TiN film 62 is removed by a mixed liquid of $NH_4OH+H_2O_2$ and the unreacted Co film 60 is removed by a mixed liquid of $HCl+H_2O_2$ (1:1). The unreacted Co film 60 may be removed by $H_2SO_4+H_2O_2$ (3:1). In this manner, a silicide layer 64 can be formed on the Si region surface and the local interconnection 65 extending on the field oxide film 52 can be formed. No interlevel insulation film is formed between the local interconnection 65 and the underlying gate electrode 58, and alignment precision for contact holes is rarely required. It is therefore possible to form a fine LSI structure with ease.

In the embodiment shown in FIGS. 12A to 12D, an Si film pattern is sandwiched between the Co film and TiN film to progress the silicidation reaction. Because the surface of the Co film is covered with the TiN film, oxidation of the Co film can be prevented and a good silicide film can be obtained.

FIGS. 13A to 13D are cross sectional views explaining a method of forming a local interconnection according to another embodiment.

Figure 13A:
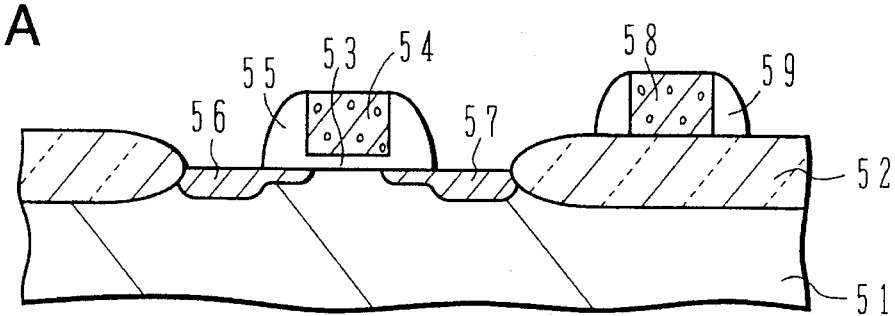
FIGS. 13A to 13D are cross sectional views explaining a method of manufacturing a semiconductor device according to a further embodiment of the invention.

As shown in FIG. 13A, a MOS transistor structure is formed on the surface of a substrate 51 in the manner well known in the art. The structure shown in FIG. 13A is similar to that shown in FIG. 12A.

Figure 13B:
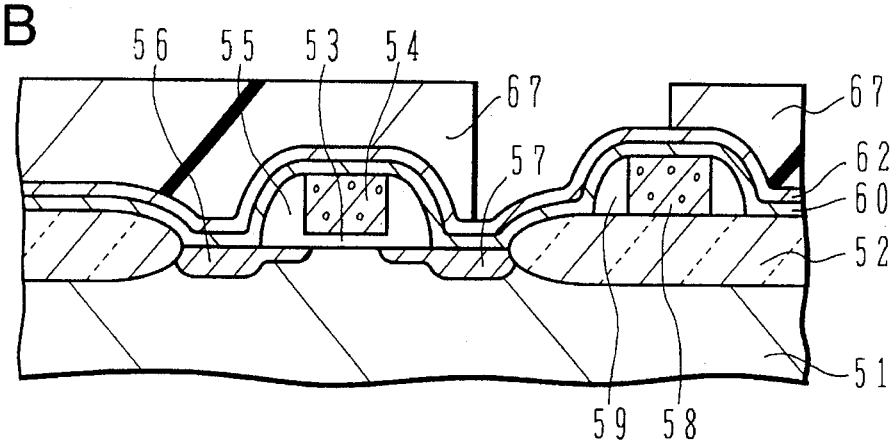

As shown in FIG. 13B, a Co film 60 is formed on the surface of the substrate 51 similar to the above embodiment. Next, a TiN film 62 is deposited by sputtering.

Thereafter, a resist mask 67 is formed over the substrate 51. The resist mask 67 has an opening where a local interconnection is formed. The TiN film 62 is etched by RIE, for example, by using a $Cl_2$ gas at a flow rate of about 100 sccm as an etching gas, at a pressure of about 50 mtorr and an RF power of 200 W.

The TiN film 62 is removed only at the region where the local interconnection is formed. Thereafter, the resist mask 62 is ashed by a down-flow of oxygen plasma.

Figure 13C:
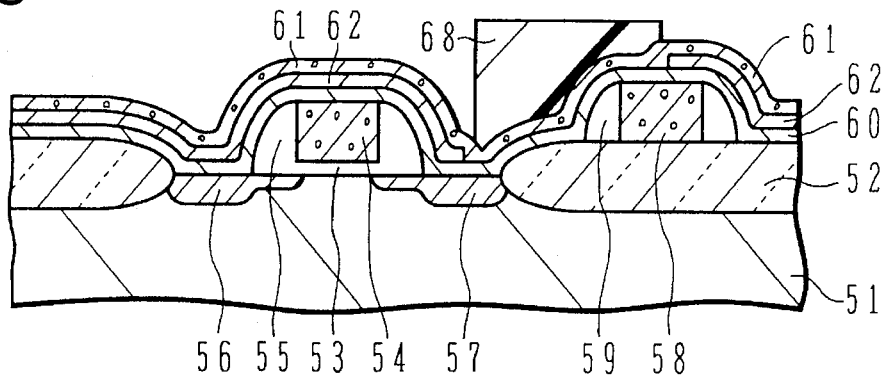

As shown in FIG. 13C, an Si film 61 is deposited on the surface of the substrate 1 to a thickness of about 30 nm by sputtering. After the Si film 61 is deposited, a resist mask 68 is formed which covers the region where a local interconnection is formed. This resist mask 68 is an inverted mask of the resist mask 67.

By using the resist mask 68 as an etching mask, the Si film 61 is etched by RIE using an $SF_6$ gas. After the Si film 61 is etched, the resist mask 68 is ashed by a down-flow of oxygen plasma.

If RIE using an $SF_6$ gas is performed at a low temperature of about −30° C. or lower, the Si film 61 can be selectively etched, scarcely etching the TiN film 62 and Co film 60. It is not necessary to provide an overlap region between the opening of the resist mask 67 shown in FIG. 13B and the resist mask 68 shown in FIG. 13C. Even if there is a small misalignment between the two masks, the clearance between the Si film pattern and the TiN film 62 deviates only slightly, and no adverse effect is given. After the Si film 61 is etched, the resist mask 68 is ashed by a down-flow of oxygen plasma.

Figure 13D:
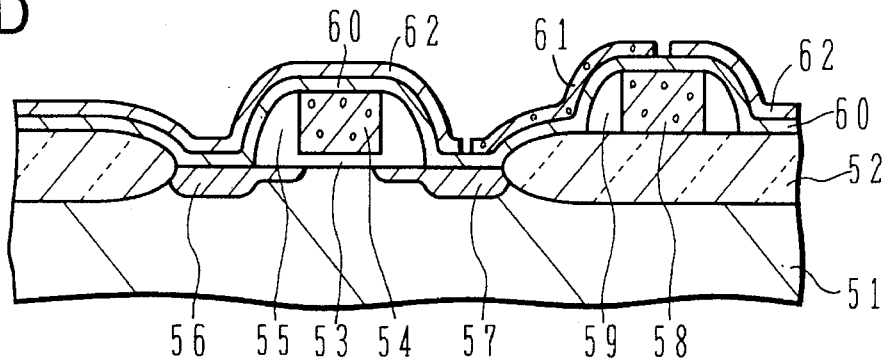

FIG. 13D is a schematic diagram showing the relationship between the Si film pattern 61 and TiN film pattern 62 formed in the above manner. The TiN film 62 substantially covers the exposed Co film 60. The Si film 61 poses no problem of a film quality change by oxidation as in the case of the Co film 60. Therefore, as shown in FIG. 13D, if the surface of the exposed Co film 60 is substantially covered with the TiN film 62, a thermal treatment thereafter can be performed stably.

A thermal treatment is then performed by RTA heating the substrate to about 1000° C. to form a silicide local interconnection such as shown in FIG. 12D. A silicide film is formed at the exposed Si surface, similar to the structure shown in FIG. 12D. Thereafter, the TiN film and unreacted Co film are washed out.

The local interconnections LI1 shown in FIG. 10B can be formed by the methods illustrated in FIGS. 12A to 12D, and 13A to 13D. If the surfaces of Si electrodes are being exposed, a local interconnection riding on another Si electrode such as shown in FIG. 11 cannot be formed. In such a case, a method illustrated in FIGS. 14A to 14D is used.

Figure 14A:
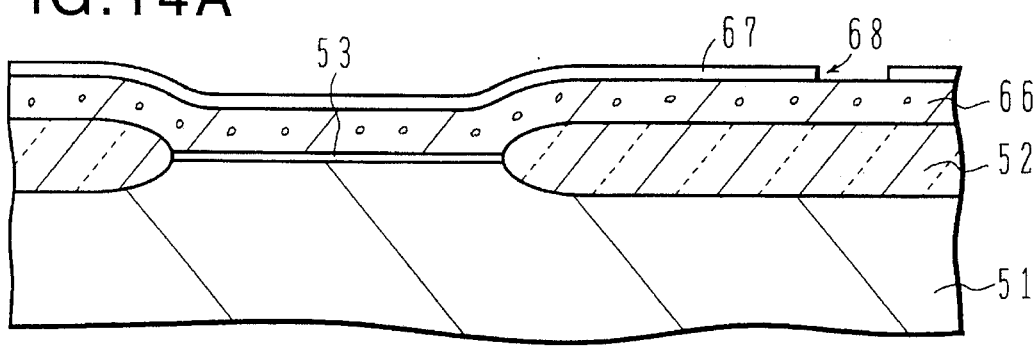
FIGS. 14A to 14D are cross sectional views explaining a method of manufacturing a semiconductor device according to a still further embodiment of the invention.

In FIG. 14A, on a Si substrate 51 provided with field oxide films 52, an amorphous silicon film 66 and a silicon nitride film 67 are stacked. An aperture (or apertures) 68 is formed in the silicon nitride film 67 in that portion where contact is to be formed.

Figure 14B:
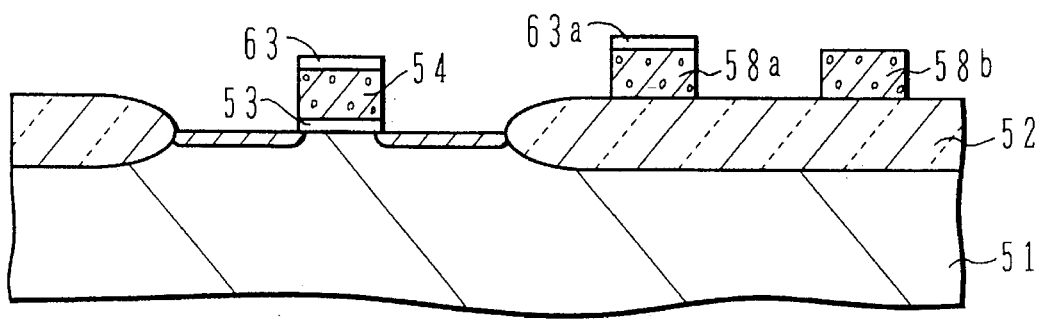

As shown in FIG. 14B, the silicon nitride film 67 and the amorphous silicon film 66 are patterned, to provide a gate electrode formed of a gate oxide film 53, the amorphous silicon film 54 and the silicon nitride film 63, a wiring formed of the amorphous silicon film 58a and the silicon nitride film 63a, and another wiring formed of amorphous silicon film 58b which has an exposed surface. Then, n-type impurities are lightly implanted to form lightly doped drain (LDD) regions.

Figure 14C:
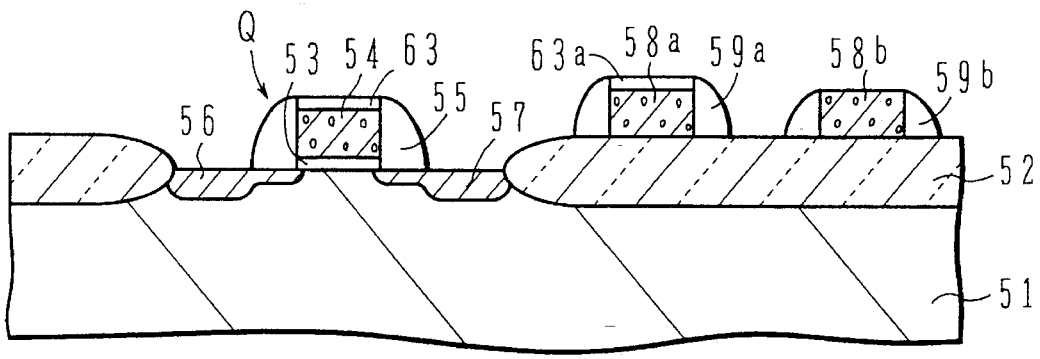

Then as shown in FIG. 14C, side wall insulating films 55, 59a and 59b are formed on the side surfaces of the gate electrode and the wirings. Then, n-type impurities are implanted to form heavily doped source/drain regions 56 and 57. In this way, a MOS transistor Q is formed on the surface portion of the substrate 51 defined by the field oxide film 52, and two silicon wiring/electrode 58a and 58b are formed on the field oxide film 52. Here, the upper surfaces of the wiring/electrode 54 and 58a are covered with SiN films 63 and 63a, and the side surfaces of the wiring/electrode 54 and 58a are covered with the side wall insulators 55 and 59a formed of silicon oxide. The other wiring/electrode 58b has an exposed upper surface.

In this way, such wiring/electrode structures is formed wherein desired region of the wiring/electrode is exposed and the other portions of the wiring/electrode are covered with insulating films.

Figure 14D:
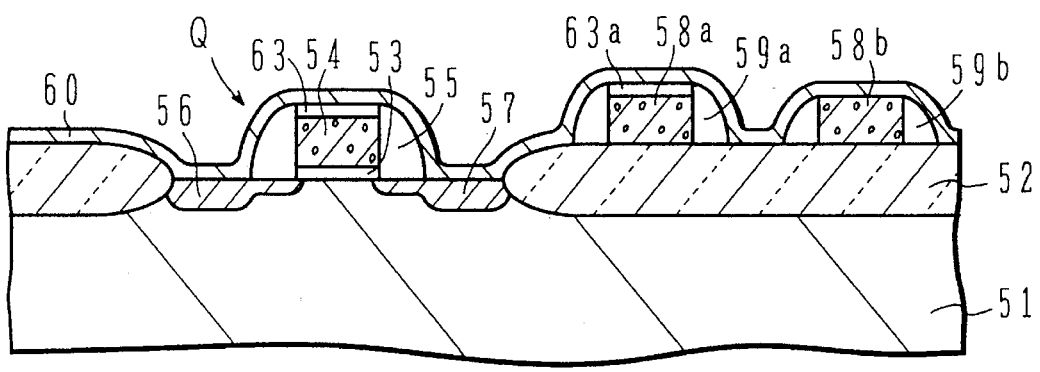

As shown in FIG. 14D, a Co film 60 is deposited over the substrate 51 by sputtering. Thereafter, an Si film and a TiN film are deposited in the manner illustrated in FIGS. 12B to 12D, and FIGS. 13B to 13D, to thereafter progress a silicidation reaction.

According to this embodiment, although there is the gate electrode 58a between the MOS transistor Q and the gate electrode 58b, a silicide local interconnection can be formed to interconnect the drain region 57 of the MOS transistor Q and the gate electrode 58b because the surface of the gate electrode 58a is covered with the SiN film 63a.

A local interconnection LI riding on another gate electrode such as shown in FIG. 11 can be formed in the above manner.

Figure 15A:
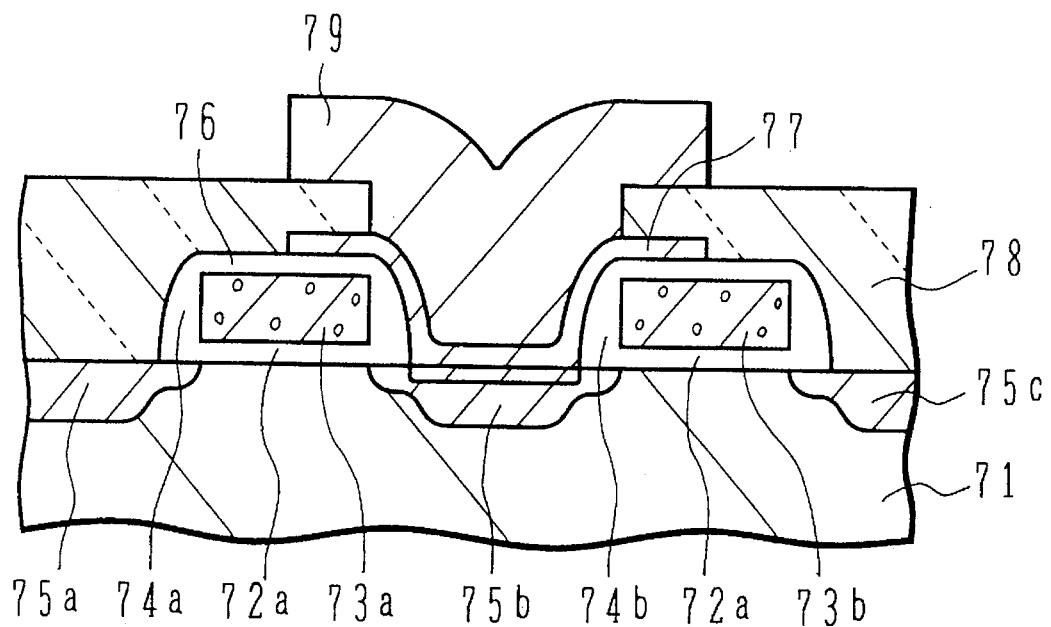
FIGS. 15A and 15B are cross sectional views explaining a method of manufacturing a semiconductor device according to another embodiment of the invention.
Figure 15B:
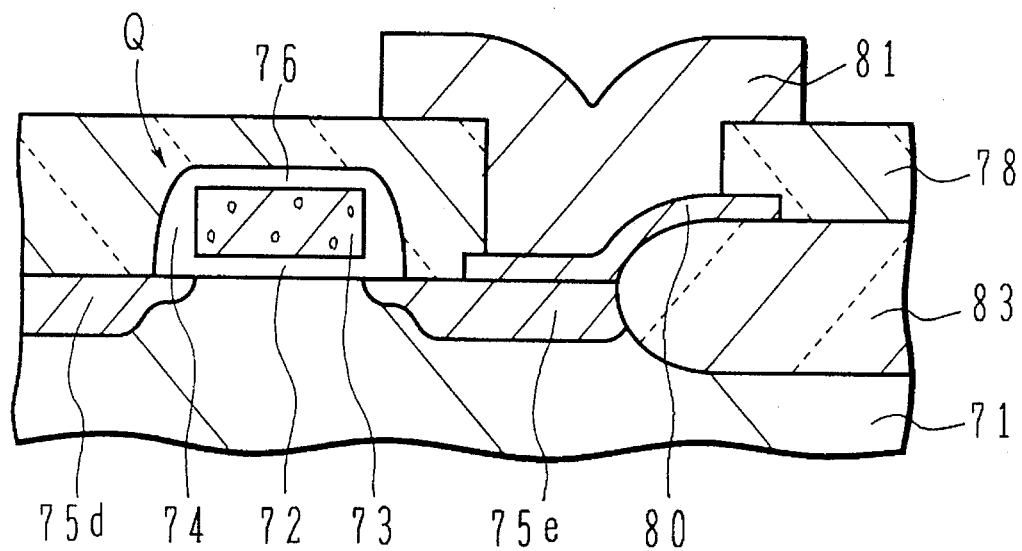

FIGS. 15A and 15B are cross sectional views explaining a method of forming a boarder-less contact. In FIG. 15A, a gate oxide film 72a is formed on the surface of, for example, a p-type Si substrate. Silicon gate electrodes 73a and 73b are formed on the gate oxide films 72a. The surfaces of the gate electrodes 73a and 73b are covered with an insulation film 76. The side walls of the gate electrodes are also covered with insulation films 74a and 74b. By using the gate electrodes as a mask, ions are implanted to form n-type regions 75a, 75b, and 75c on the surface region 71 of the p-type substrate. This structure can be formed by the process explained with FIG. 14A.

A silicide pad 77 is formed in the method similar to the above embodiment. This pad 77 extends from the n-type region 75b to the insulation films 76 covering the adjacent two gate electrodes 73a and 73b. The pad 77 has an area broader than the exposed surface of the Si substrate 71.

An interlevel insulation film 78 is formed covering the pad 77, and a contact hole is formed in the interlevel insulation film 78. This contact hole is aligned in position with the pad 77. This alignment precision may be more rough than that of the exposed surface of the n-type region 75b.

Thereafter, an electrode layer 79 such as an Al layer is formed over the Si substrate 71 and patterned to form a wiring 79 which is connected via the pad 77 to the n-type region 75b.

FIG. 15B shows another example of a border-less contact. A field oxide film 83 is formed on the surface of an Si substrate 71, and a MOS transistor Q is formed in the active region defined by the field oxide film 83. The MOS transistor Q has the structure that an insulation film 76 covers the surface of the gate electrode, similar to the MOS transistor shown in FIG. 15A.

Specifically, a laminated layer of a gate insulation film 72, gate electrode 73, and insulation film 76 is formed on the surface of the Si substrate 71. This laminated layer is patterned to form a gate electrode structure with an insulated surface. The sides of the gate electrode structure are covered with an insulation film to form side walls 74. On both the sides of the gate electrode, n-type regions 75d and 75e are formed.

A silicide pad 80 is formed by the method similar to the above embodiment, the silicide pad 80 extending from the surface of the n-type region 75e to the surface of the field oxide film 83. Thereafter, the surface of the substrate is covered with an interlevel insulation film 78, and an opening for the pad 80 is formed therein.

Thereafter, a wiring layer such as an Al layer is formed on the surface of the substrate, and patterned to form a wiring 81. An interconnection between the wiring 81 and the n-type region 75e is realized by using the boarder-less contact pad 80, thereby relieving a precise position alignment.

By performing silicidation reaction in a state where Co film surface, at least those Co film surfaces not covered by Si film, is covered with TiN film, unevenness of the surface after the silicidation reaction is decreased to improve the surface morphology. Also, the surface of Co film is not oxidized at the thermal treatment, preventing increase in the sheet resistivity of the silicide film. When the width of a wiring is thin, the resistivity of the silicide wiring can be easily increased. By performing silicidation reaction in a state where a Co film is covered with a TiN film, the dependency of the resistivity on the wiring width is decreased. Also, it is possible to form good CoSi even on those Si surfaces adjacent to LOCOS oxide films.

In the embodiments described above, a Co film having a thickness of about 10 nm has been used. The thickness may be set to a desired value in the range from 5 to 50 nm. A Si film having a thickness of about 30 nm has been used. The thickness may be set to a desired value in the range from 20 to 200 nm. The processes of patterning the Si film and TiN film are not limited to those described in the embodiments. A silicide electrode and interconnection can be applied to other circuits than the embodiment circuits.

In the embodiments shown in FIGS. 1A to 1C, 2A to 2C, 3A to 3C, 4A, and 4B, a silicidation reaction is performed twice. A local interconnection may be formed by the same silicidation reaction. If the second silicidation reaction is used, a local interconnection to a gate electrode can be formed.

Figure 16:
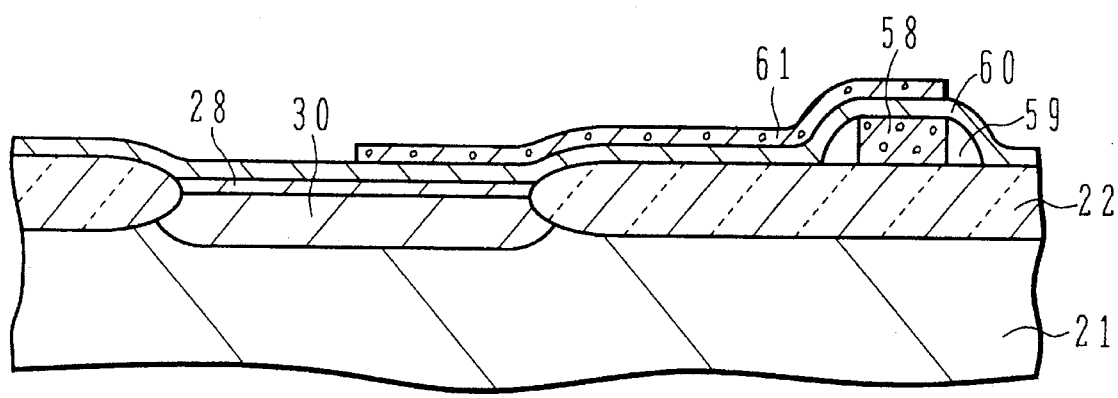
FIG. 16 is a cross sectional view of a semiconductor substrate for illustrating another embodiment of the invention.

FIG. 16 shows a case where a silicide local interconnect is formed on a drain region provided with a silicide layer. For example, through the steps up to FIG. 3B, a drain region 30 and a Co silicide film 28 formed thereon, are formed on the surface of a silicon substrate 21. On filed oxide film 22, a silicon wiring 58 provided with sidewall oxide 59 is formed.

A Co film 60 is deposited on the whole surface of the substrate by sputtering. Further, a Si film 61 is deposited thereon by sputtering. The Si film 61 is patterned to the shape of a desired local interconnect, by using photolithography. Since the surface of the drain region 30 is already covered with the Co silicide film 28, it is chemically stabilized. Thus, a TiN film used in the foregoing embodiment can be dispensed with. Then, silicidation reaction is carried out similar to the step illustrated in FIG. 12D.

Although Co film is used as a silicidable metal, it can be replaced with Ni film which can be silicified at a lower temperature. For example, Ni film 60 is deposited to a thickness of 10 nm by sputtering, and a Si film 61 is deposited to a thickness of 30 nm by sputtering thereon. The Si film is patterned to a local interconnect shape. For example, a resist mask is formed on the substrate. The substrate is loaded in a parallel plate RIE etching device. A mixed gas of $SF_6$ 150 sccm +$N_2$ 30 sccm is supplied, and RIE is carried out at a pressure of 0.1 Torr with a RF power of 200 W. Thereafter, the substrate is subjected to thermal treatment by RTA at 450° C. for 30 seconds, to carry out silicidation reaction. Then, non-reacted Ni film is removed by $HCl:H_2O_2$=1:1 or $H_2SO_4:H_2O_2$. By these steps, a good silicide wiring can be formed.

The present invention has been described in connection with the preferred embodiments. The invention is not limited only to the above embodiments. It is apparent to those skilled in the art that various modifications, substitutions, combinations and the like can be made without departing from the scope of the appended claims.

We claim:

1. A method of manufacturing a semiconductor device comprising the steps of:

forming, on a silicon substrate, a gate insulation film and a silicon gate electrode thereon;

covering the exposed surface of said silicon gate electrode with an insulation film;

exposing the surface of said substrate on the opposite sides of said gate electrode;

forming a first refractory metal film over said substrate surface;

heating said substrate to progress a silicidation reaction between said first refractory metal film, and said substrate surface to form a first refractory metal silicide film;

removing an unreacted portion of said first refractory metal film;

removing said insulation film on said gate electrode to expose the surface of said gate electrode;

simultaneously implanting impurity ions into said silicon gate electrode, where there is no silicide thereon, and into said substrate surface through said first refractory metal silicide film; and heating said substrate to activate said impurity ions.

2. A method according to claim 1, further comprising the steps of:

after said impurity ion implanting step, forming a second refractory metal film covering said gate electrode; and heating said substrate to progress a silicidation reaction between said second refractory metal film and said silicon gate electrode to form a second refractory metal silicide film.

3. A method according to claim 2, wherein said second refractory metal film is formed also on said first refractory metal silicide film to form said second refractory metal silicide film also on said first refractory metal silicide film.

4. A method according to claim 1, wherein said step of forming said first refractory metal silicide film includes a step of heating said substrate from the upper surface thereof by a lamp.

5. A method according to claim 2, wherein said step of forming said second refractory metal silicide film includes a step of heating said substrate from the upper surface thereof by a lamp.

6. A method according to claim 1, wherein said step of activating said impurity ions includes a step of heating said substrate from the upper surface thereof by a lamp.

7. A method according to claim 1, wherein said step of covering the exposed surface of said gate electrode with an insulation film includes a step of covering said gate electrode with a first insulation film concurrently with said gate electrode forming step and a step of depositing a second insulation film over the whole surface of said substrate and anisotropically etching said second insulation film to cover side walls of said gate electrode with a side wall insulation film.

8. A method according to claim 7, wherein said first and second insulation films are etched at different rates during the anisotropic etching step.

9. A method according to claim 8, wherein said first insulation film is a silicon nitride film and said second insulation film is a silicon oxide film.

10. A method according to claim 1, further comprising a step of forming a oxide film on said gate electrode and said first refractory metal silicide film prior to said impurity ion implanting step.

11. A method according to claim 1, wherein said impurity ions are arsenic, phosphorus or boron ions.

* * * * *